United States Patent
Kim

(10) Patent No.: US 12,446,148 B2
(45) Date of Patent: Oct. 14, 2025

(54) CIRCUIT BOARD ASSEMBLY

(71) Applicant: HYUNDAI MOBIS CO., LTD., Seoul (KR)

(72) Inventor: Myeong Je Kim, Yongin-si (KR)

(73) Assignee: HYUNDAI MOBIS CO., LTD., Seoul (KR)

( * ) Notice: Subject to any disclaimer, the term of this patent is extended or adjusted under 35 U.S.C. 154(b) by 0 days.

(21) Appl. No.: 17/649,156

(22) Filed: Jan. 27, 2022

(65) Prior Publication Data

US 2022/0256691 A1 Aug. 11, 2022

(30) Foreign Application Priority Data

Feb. 9, 2021 (KR) .................. 10-2021-0018589

(51) Int. Cl.
*H05K 1/02* (2006.01)
*H05K 1/11* (2006.01)
*H05K 1/18* (2006.01)

(52) U.S. Cl.
CPC ......... *H05K 1/0271* (2013.01); *H05K 1/0203* (2013.01); *H05K 1/023* (2013.01); *H05K 1/181* (2013.01); *H05K 1/111* (2013.01); *H05K 2201/09063* (2013.01)

(58) Field of Classification Search
CPC .... H05K 1/0271; H05K 1/0203; H05K 1/023; H05K 2201/09063; H05K 2201/066; H05K 2201/10015; H05K 2201/2009; H05K 2201/2045; H05K 1/181
See application file for complete search history.

(56) References Cited

U.S. PATENT DOCUMENTS

| | | | | |
|---|---|---|---|---|
| 6,233,816 | B1 * | 5/2001 | Franke | H05K 1/18 29/829 |
| 2008/0003846 | A1 * | 1/2008 | Miyagawa | H05K 1/0231 439/71 |
| 2008/0218984 | A1 * | 9/2008 | Togashi | H05K 1/0271 174/254 |
| 2009/0151991 | A1 * | 6/2009 | Furutani | H05K 1/0271 174/260 |
| 2009/0266595 | A1 * | 10/2009 | Togashi | H05K 1/0271 174/260 |

(Continued)

FOREIGN PATENT DOCUMENTS

| | | |
|---|---|---|
| JP | H06132547 | 5/1994 |
| KR | 20040009149 | 1/2004 |
| KR | 20090064337 | 6/2009 |

OTHER PUBLICATIONS

Korean Office Action dated May 20, 2025 issued in Korean Application No. 10-2021-0018589.

*Primary Examiner* — Ishwarbhai B Patel
(74) *Attorney, Agent, or Firm* — DLA PIPER LLP (US)

(57) ABSTRACT

A circuit board assembly including a circuit board, which has one surface on which circuit elements including a vibration element are mounted, and a cover, which covers at least a portion of the circuit board to reduce a vibration of the circuit board caused by a vibration of the vibration element. The cover includes a cover body spaced apart from the one surface and a partition wall protruding from a surface of the cover body, which faces the circuit board, to cover at least a portion of the vibration element. The partition wall presses the one surface.

13 Claims, 7 Drawing Sheets

(56) References Cited

U.S. PATENT DOCUMENTS

| | | | |
|---|---|---|---|
| 2012/0255767 A1* | 10/2012 | Toratani | H05K 1/0263 |
| | | | 174/260 |
| 2018/0007787 A1* | 1/2018 | Yatsugi | H05K 1/05 |
| 2018/0092240 A1* | 3/2018 | Rojahn | H05K 1/18 |
| 2019/0297724 A1* | 9/2019 | Chiu | H05K 1/181 |

* cited by examiner

CIRCUIT BOARD ASSEMBLY

CROSS-REFERENCE TO RELATED APPLICATION(S)

This application claims priority from and the benefit of Korean Patent Application No. 10-2021-0018589, filed on Feb. 9, 2021, which is hereby incorporated by reference for all purposes as if set forth herein.

TECHNICAL FIELD

Exemplary embodiments relate to a circuit board assembly.

BACKGROUND

Circuit boards on which circuit elements are mounted have bypass elements for removing AC noises that are generated in output terminals. Such a bypass element generally uses a multi layer ceramic capacitor (MLCC), and the multi layer ceramic capacitor produces a piezoelectric phenomenon due to input of AC noises.

The circuit board on which the bypass element is mounted may vibrate at a predetermined frequency through the piezoelectric phenomenon of the bypass element. As illustrated in FIG. 1, the bypass element may be expanded in an expansion direction by applying a voltage or may be restored in a direction opposite to the expansion direction by removing application of the voltage. Due to the repetition of expansion and restoration of the bypass element, the bypass element may vibrate at a certain frequency and make the circuit board vibrate. Finally, the noises from about 20 Hz to about 20 kHz due to the vibration of the circuit board are heard by a user.

According to the related art to solve the above limitation, soldering using an additional structure or heat treatment separately applied on an MLCC has been tried to reduce the vibration of the circuit board caused by the bypass element. However, there were no significant effects in terms of both costs due to the separate process and reduction in noise.

SUMMARY

Exemplary embodiments of the present invention provide a circuit board assembly that reduces noises due to vibration of a circuit board.

A first exemplary embodiment of the present invention provides a circuit board assembly including: a circuit board having one surface on which circuit elements including a vibration element are mounted; and a through-hole which passes through from the one surface to the other surface on the opposite side from the one surface to prevent a vibration of the vibration element from being transmitted to the circuit board, wherein when the one surface is viewed in a direction perpendicular to the one surface, the through-hole is disposed surrounding at least a portion of the perimeter of the vibration element.

In another example, the through-hole may include a first through-hole and a second through-hole spaced apart from the first through-hole, wherein when the one surface is viewed in the direction perpendicular to the one surface, the first through-hole and the second through-hole are arranged on both sides of the vibration element in a direction in which the vibration element vibrates in parallel to the one surface.

A second exemplary embodiment of the present invention provides a circuit board assembly including: a circuit board having one surface on which circuit elements including a vibration element are mounted; and a cover which covers at least a portion of the circuit board to reduce a vibration of the circuit board caused by a vibration of the vibration element, wherein the cover includes: a cover body spaced apart from the one surface; and a partition wall protruding from a surface of the cover body, which faces the circuit board, to cover at least a portion of the vibration element, the partition wall pressing the one surface.

In another example, the cover body may be provided to press the vibration element toward the circuit board.

In another example, the partition wall may be provided in close contact with a side surface of the vibration element.

In another example, the cover may be configured such that the partition wall is formed integrally with the cover body.

In another example, the partition wall may include a first partition wall and a second partition wall spaced apart from the first partition wall, wherein when the one surface is viewed in a direction perpendicular to the one surface, the first partition wall and the second partition wall are arranged on both sides of the vibration element in a direction in which the vibration element vibrates in parallel to the one surface.

In a modified example, the circuit board assembly may further include a heat sink which is disposed in close contact with the other surface of the circuit board on the opposite side from the one surface and presses the other surface.

In another modified example, the circuit board assembly may further include a tape which connects the heat sink to the circuit board and is made of a material including a heat conductive material.

In another example, the heat sink may press the entire region of the other surface of the circuit board.

In another example of the circuit board assembly, the vibration element may include a first vibration element and a second vibration element spaced apart from the first vibration element, wherein when a main vibration direction is referred to as a direction of a vibration having the greatest amplitude or frequency among vibrations of the vibration element, the first vibration element and the second vibration element are arranged such that the main vibration direction of the first vibration element intersects with the main vibration direction of the second vibration element.

In another modified example, the first vibration element and the second vibration element may be arranged such that the main vibration direction of the first vibration element is perpendicular to the main vibration direction of the second vibration element.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION

Figure 1:
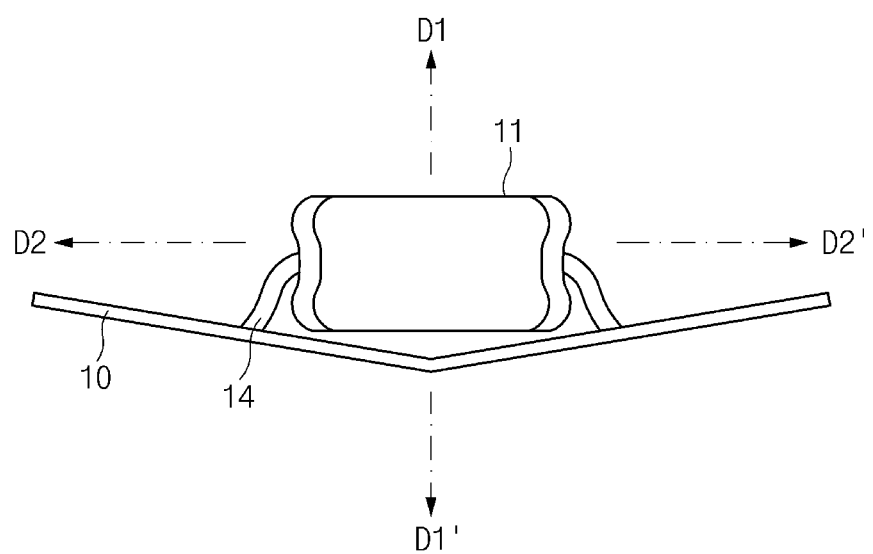
FIG. 1 is a side view illustrating a state in which a circuit board is vibrated by expansion of a piezoelectric element and vibration of a vibration element due to application of voltage.

Hereinafter, exemplary embodiments of the present disclosure will be described in more detail with reference to the accompanying drawings. When reference numerals are given to elements in each drawing, the same elements will be designated by the same reference numerals if possible although they are shown in different drawings. Also, in describing exemplary embodiments of the present disclosure, a detailed description of related known configurations or functions will be omitted when it is determined that the understanding of the exemplary embodiments of the present disclosure is hindered by the detailed description.

Exemplary Embodiment of the Present Disclosure

Figure 2:
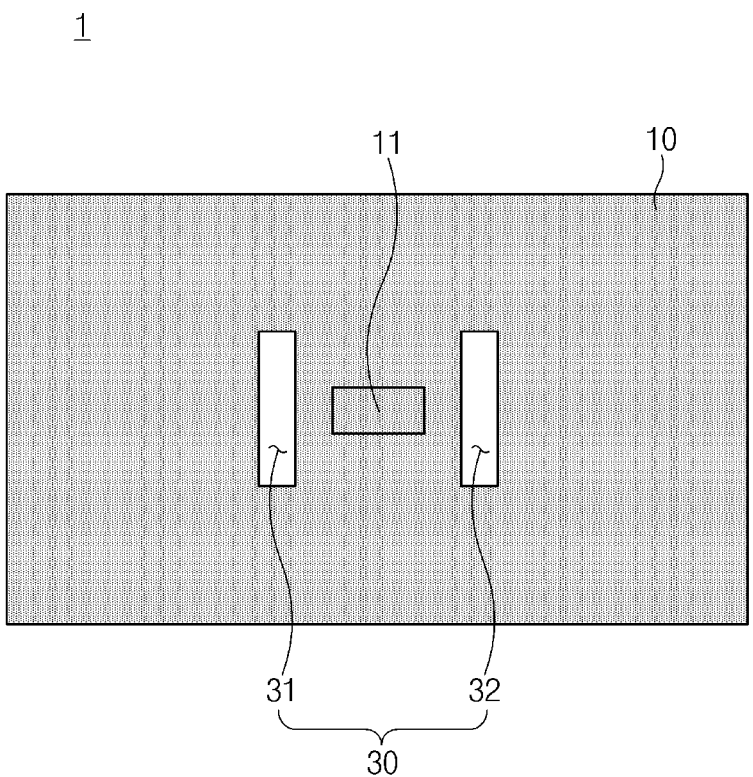
FIG. 2 is a plan view illustrating a circuit board assembly according to an exemplary embodiment of the present disclosure.

A circuit board assembly 1 according to the present disclosure relates to a circuit board assembly 1 that inhibits vibration of a vibration element 11 from being transmitted to a circuit board 10. FIG. 1 is a side view illustrating a state in which a circuit board is vibrated by expansion of a piezoelectric element and vibration of a vibration element due to application of voltage. FIG. 2 is a plan view illustrating a circuit board assembly according to an exemplary embodiment of the present disclosure.

As illustrated in FIG. 2, a circuit board assembly 1 according to an exemplary embodiment of the present disclosure includes a circuit board 10 and a through-hole 30.

Circuit elements including a vibration element 11 may be mounted to one surface 12 of the circuit board 10. As illustrated in FIG. 1, the vibration element 11 may be a capacitor that repeatedly expands and contracts according to a piezoelectric effect and applies vibration to the circuit board 10. More specifically, the vibration element 11 may be a multi layer ceramic capacitor (MLCC). However, the vibration element 11 is not limited thereto, and may be various types of circuit elements that apply vibration to the circuit board 10.

The through-hole 30 may pass through from one surface 12 of the circuit board 10 to the other surface 13.

As illustrated in FIG. 2, the through-hole 30 may be disposed surrounding at least a portion of the perimeter of the vibration element 11. FIG. 2 illustrates that two through-holes 30 are arranged on both sides of the vibration element 11, but the present disclosure is not limited thereto.

According to an exemplary embodiment of the present disclosure, the through-hole 30 is disposed in the circuit board 10, and this may prevent the vibration of the vibration element 11 from propagating to a region other than regions adjacent to the vibration element 11 among the regions of the circuit board 10. Thus, the through-hole 30 may more effectively reduce the noises that are generated by the vibration of the circuit board 10.

Also, the through-hole 30 may include a first through-hole 31 and a second through-hole 32. The second through-hole 32 may be spaced apart from the first through-hole 31.

The first through-hole 31 and the second through-hole 32 may be arranged on both sides of the vibration element 11 in a direction in which the vibration element 11 vibrates in parallel to the one surface 12 of the circuit board 10. A vibration direction D2-D2' (see FIG. 1), which is a direction in which the vibration element 11 vibrates in parallel to the one surface 12 of the circuit board 10, is illustrated in the exemplary embodiment of the present disclosure.

The first through-hole 31 and the second through-hole 32 are arranged on both the sides of the vibration element 11 in the direction in which the vibration element 11 vibrates, and this may more effectively reduce the propagation of the vibration of the vibration element 11 to the circuit board 10.

Another Exemplary Embodiment of the Present Disclosure

Figure 3:
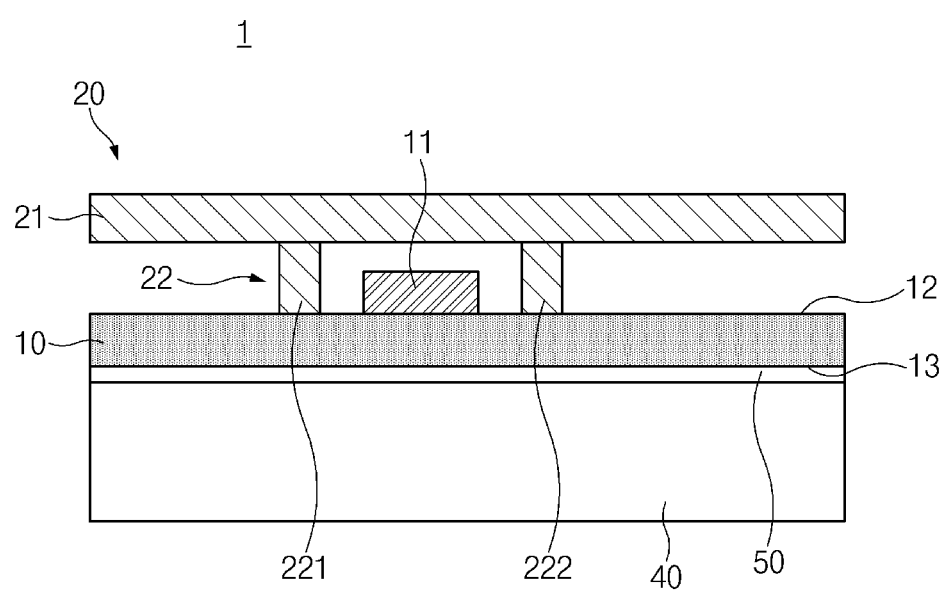
FIG. 3 is a cross-sectional view illustrating a circuit board assembly according to another exemplary embodiment of the present disclosure.
Figure 4:
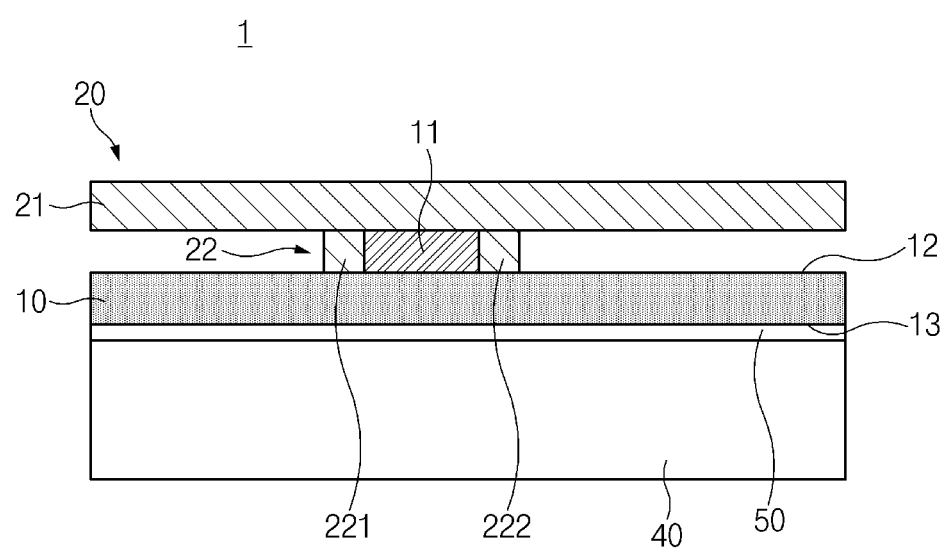
FIG. 4 is a cross-sectional view illustrating a circuit board assembly according to a modified example of another exemplary embodiment of the present disclosure.

FIG. 3 is a cross-sectional view illustrating a circuit board assembly according to another exemplary embodiment of the present disclosure. FIG. 4 is a cross-sectional view illustrating a circuit board assembly according to a modified example of another exemplary embodiment of the present disclosure.

Hereinafter, circuit board assemblies 1 according to another exemplary embodiment of the present disclosure will be described with reference to FIGS. 3 and 4. Components identical or equivalent to those of the circuit board assembly 1 of the above-described exemplary embodiment are denoted by identical or equivalent reference numerals, and detailed descriptions thereof will be omitted.

A circuit board assembly 1 according to another exemplary embodiment of the present disclosure includes a cover 20. The cover 20 may cover at least a portion of one surface 12 of a circuit board 10. The cover 20 may include a cover body 21 and a partition wall 22.

The cover body 21 may be spaced apart from the one surface 12 of the circuit board 10. As illustrated in FIG. 3, the cover body 21 may be spaced apart from the one surface 12 of the circuit board 10 and disposed in parallel to the circuit board 10. The partition wall 22 may be connected to a surface of the cover body 21 that faces the one surface 12 of the circuit board 10.

The partition wall 22 may protrude from a surface of the cover body 21, which faces the one surface 12 of the circuit board 10, toward the one surface 12 of the circuit board 10. The partition wall 22 may press the one surface 12 of the circuit board 10. The partition wall 22 may be disposed surrounding at least a portion of a vibration element 11.

As illustrated in FIG. 3, two partition walls 22 may be arranged on both sides of the vibration element 11. However, the exemplary embodiments are not limited thereto, and at least three partition walls 22 may be disposed to press the one surface 12 of the circuit board 10 while surrounding at least a portion of the vibration element 11.

The cover 20 is provided to cover at least a portion of the circuit board 10, and this may prevent noises caused by the vibration of the circuit board 10 from being heard by a user. Also, the partition walls 22 are disposed pressing the one surface 12 of the circuit board 10, and this may reduce a phenomenon in which the vibration of the vibration element 11 is transmitted to the circuit board 10 and causes the circuit board 10 to vibrate together.

Also, the cover body 21 may be formed integrally with the partition walls 22. For example, the cover 20 may be injection-molded so as to press a portion of the one surface 12 of the circuit board 10. On the other hand, the cover body 21 and the partition wall 22 are formed separately from each other and then assembled on the circuit board 10.

When the cover body 21 is formed integrally with the partition walls 22, a manufacturing process for the cover 20 and an assembly process for a circuit board assembly 1 may be simplified. Also, vibrations generated due to gaps between the cover body 21 and the partition walls 22 may be prevented. On the other hand, when the cover body 21 is provided separately from the partition wall 22, each of cover bodies 21 and partition walls 22 having relatively simplified structures may be mass-produced. Thus, there may be advantages in terms of productivity of the cover 20.

The partition walls 22 may include a first partition wall 221 and a second partition wall 222. The second partition wall 222 may be spaced apart from the first partition wall 221. The first partition wall 221 and the second partition wall 222 may be arranged on both sides of the vibration element 11 in a direction in which the vibration element 11 vibrates in parallel to the one surface 12 of the circuit board 10. As illustrated in FIG. 1, a vibration direction D2-D2' of the vibration element 11 may be parallel to the one surface 12 of the circuit board 10 and may be parallel to the direction in which a plurality of connection members 14 are spaced apart from each other. The connection members 14 may be components which are arranged on both sides of the vibration element 11 and connect the vibration element 11 to the circuit board 10.

As illustrated in FIG. 3, the first partition wall 221 and the second partition wall 222 are arranged on both the sides of the vibration element 11 in the direction in which the vibration element 11 vibrates, and thus, the partition walls 22 may more effectively prevent the circuit board 10 from being vibrated due to the vibration of the vibration element 11 and reduce the noise caused by the vibration of the circuit board 10. Also, as illustrated in FIG. 3, according to an exemplary embodiment of the present disclosure, each of the cover body 21 and the partition walls 22 may be spaced apart from the vibration element 11.

On the other hand, as illustrated in FIG. 4, according to a modified example of the exemplary embodiment of the present disclosure, a cover body 21 may be disposed to press a vibration element 11 toward a circuit board 10. Also, a partition wall 22 may be disposed in close contact with the side surfaces of the vibration element 11.

According to the modified example of the exemplary embodiment of the present disclosure, the cover body 21 and the partition wall 22 are disposed to press the vibration element 11, and this may minimize the vibration of the vibration element 11. Thus, the cover 20 prevents the vibration of the vibration element 11 and thus may more effectively reduce the noises that are generated by the vibration of the circuit board 10.

Figure 6:
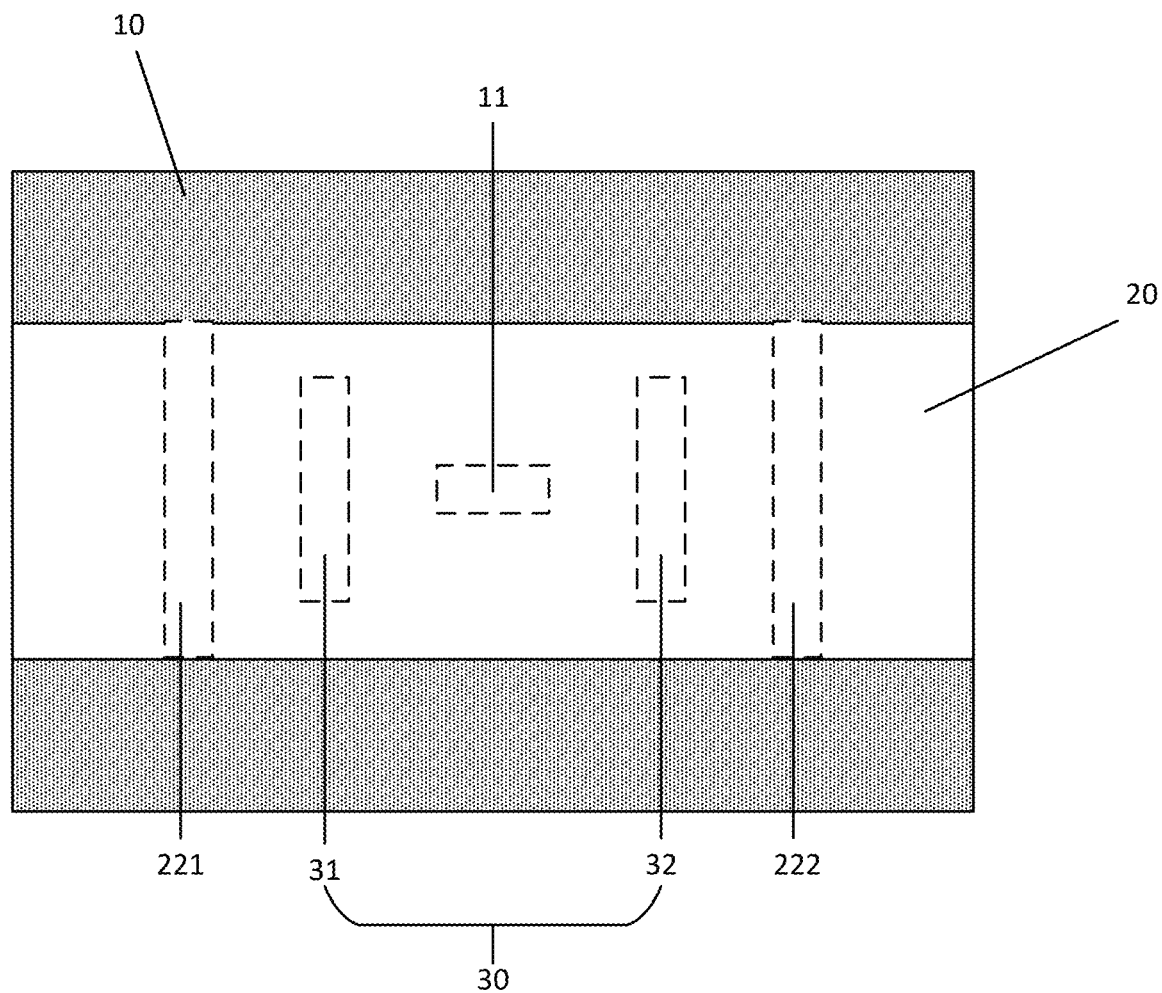
FIG. 6 is a plan view illustrating a circuit board assembly according to an exemplary embodiment of the present disclosure.
Figure 7:
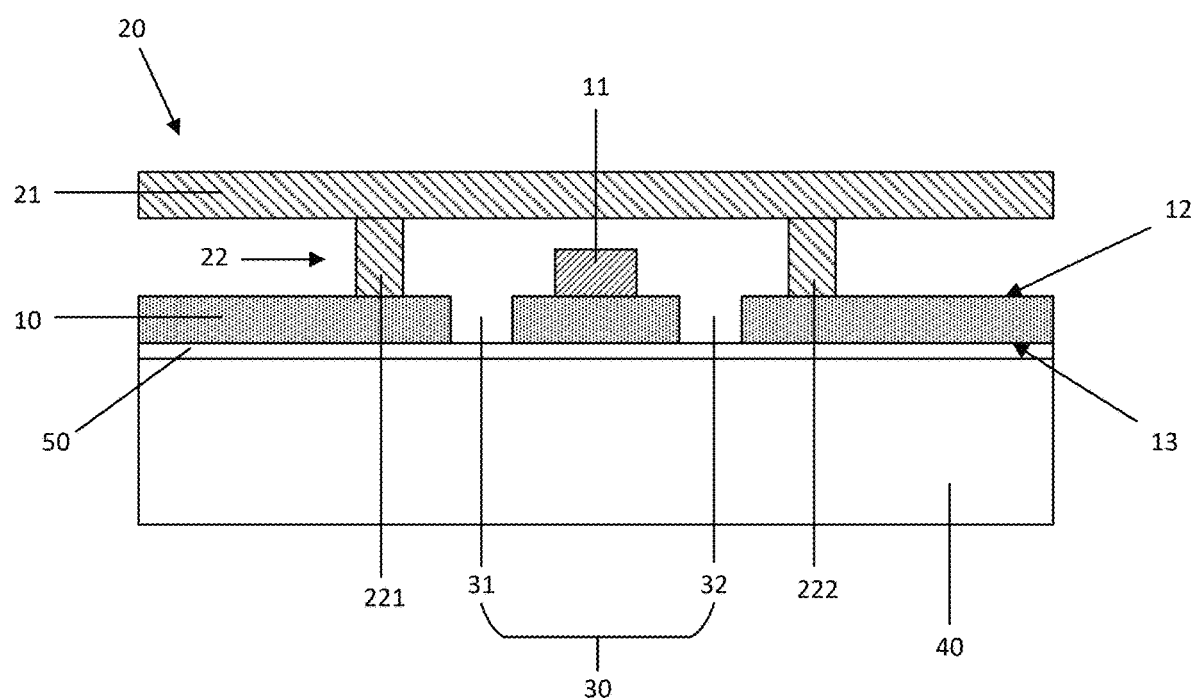
FIG. 7 is a cross-sectional view illustrating a circuit board assembly according to another exemplary embodiment of the present disclosure.

Also, the circuit board assembly 1 according to the present disclosure may include the through-holes 30 and the cover 20 together, as illustrated in FIGS. 6 and 7. That is, the exemplary embodiment of the present disclosure described above and another exemplary embodiment of the present disclosure may be embodied together in the circuit board assembly 1 according to the present disclosure. For example, although not clearly illustrated in the drawings, two through-holes 30 may be provided and arranged on both sides of the vibration element 11 so as to be parallel to a direction in which the vibration element 11 vibrates, and two partition walls 22 may also be provided and arranged on both the sides of the respective through-holes 30 on the opposite sides from the vibration element 11. That is, the numbers and the configurations of positions of each of through-holes 30 and covers 20 are not limited to the drawings or description disclosed in the present disclosure, and the circuit board assembly 1 according to the present disclosure encompasses various numbers and arrangement configurations of partition walls 22 and through-holes 30 which may be embodied by a person skilled in the art so as to reduce the noises of the circuit board 10.

Also, as illustrated in FIGS. 3 and 4, the circuit board assembly 1 according to the present disclosure may further include a heat sink 40. The heat sink 40 may be disposed in close contact with the other surface 13 of the circuit board 10 on the opposite side from the one surface 12. The heat sink 40 may include an endothermic material that absorbs heat from the circuit board 10.

The heat sink 40 is disposed in close contact with the other surface 13 of the circuit board 10, and this may reduce a phenomenon in which the circuit board 10 is vibrated by the vibration of the vibration element 11. Thus, the heat sink 40 may be a component for further reducing the noises due to the vibration of the circuit board 10.

More specifically, the heat sink 40 according to the present disclosure may be disposed to press the entire region of the other surface 13 of the circuit board 10. In this case, the noise due to the vibration of the circuit board 10 may be more effectively reduced by the heat sink 40. As an example, the surface area of the heat sink 40 may be equal to the surface area of the other surface 13 of the circuit board 10 when viewed in a direction perpendicular to the other surface 13 of the circuit board 10. On the other hand, the surface area of the heat sink 40 may be different from the surface area of the other surface 13 of the circuit board 10 in a region in which the heat sink 40 and the circuit board 10 face each other.

Also, the heat sink 40 may further include a tape 50 disposed between the heat sink 40 and the circuit board 10. The tape 50 may connect the heat sink 40 to the circuit board 10. The tape 50 may be made of materials that include an adsorbent material and a heat conductive material.

As the tape 50 is disposed, the tape 50 may partially absorb the vibration of the circuit board 10 due to the vibration of the vibration element 11. Thus, the noises due to the vibration of the circuit board 10 may be further reduced. Also, the tape 50 may reinforce the connection between the heat sink 40 and the circuit board 10 and prevent the circuit board 10 from overheating.

Another Example of the Present Disclosure

Figure 5:
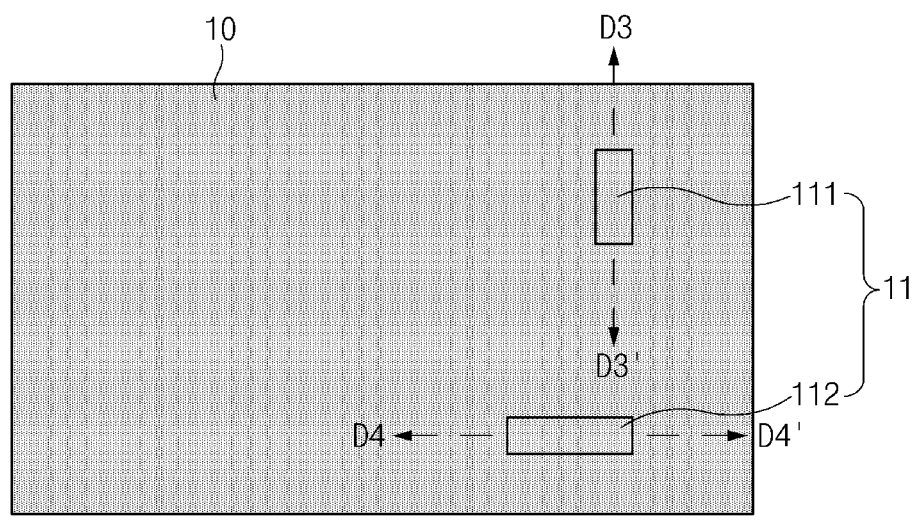
FIG. 5 is a plan view illustrating a circuit board assembly according to another example of the present disclosure.

FIG. 5 is a plan view illustrating a circuit board assembly according to another example of the present disclosure.

A circuit board assembly 1 according to another example of the present disclosure may include a first vibration element 111 and a second vibration element 112. Here, according to another example of the present disclosure, the first vibration element 111 and the second vibration element 112 may be arranged such that main vibration directions thereof intersect with each other.

The main vibration direction may be defined as a direction of the vibration having the greatest amplitude or frequency among directions in which the vibration element 11 vibrates in parallel to one surface 12 of a circuit board 10.

For example, as illustrated in FIG. 5, when the main vibration directions of the first vibration element 111 and the second vibration element 112 are D3-D3' and D4-D4', respectively, the first vibration element 111 and the second vibration element 112 may be arranged such that the directions of D3-D3' and D4-D4' intersect with each other. Also, the first vibration element 111 and the second vibration element 112 may be arranged such that the main vibration directions thereof are perpendicular to each other. However, on the other hand, the first vibration element 111 and the second vibration element 112 may be arranged such that the main vibration directions thereof form an acute angle or an obtuse angle.

According to another example of the present disclosure, the first vibration element 111 and the second vibration element 112 may be arranged such that the main vibration directions thereof intersect with each other, and thus, the vibrations transmitted from the vibration elements 11 to the circuit board 10 may be canceled out.

According to the present disclosure, the vibration of the circuit board due to the vibration of the vibration element is prevented, and thus, the noises due to the vibration of the circuit board may be reduced.

Also, according to the present disclosure, the vibration elements are arranged in directions in which the vibrations of the vibration elements are canceled out each other, and thus, the noises due to the vibration of the circuit board may be reduced.

The technical ideas of the present disclosure have been described merely for illustrative purposes, and those skilled in the art will appreciate that various changes and modifications are possible without departing from the essential features of the present disclosure. Thus, the exemplary embodiments of the present disclosure are to be considered illustrative and not restrictive, and the technical spirit of the present disclosure is not limited to the foregoing exemplary embodiments. The protective scope of the present disclosure is defined by the appended claims, and all technical ideas within their equivalents should be interpreted as being included in the scope of the present disclosure.

What is claimed is:

1. A circuit board assembly comprising:
   a circuit board having one surface on top of which a rectangular vibration element is mounted;
   a through-hole which passes through the circuit board from the one surface to a second surface on an opposite side of the one surface to prevent a vibration of the rectangular vibration element from being transmitted to the circuit board, the through-hole comprising a first rectangular through-hole and a second rectangular through-hole spaced apart from the first rectangular through-hole,
   wherein when the circuit board is viewed in a direction perpendicular to the one surface, the through-hole is disposed surrounding at least a portion of a perimeter of the rectangular vibration element, such that the first rectangular through-hole completely surrounds a first short side of the rectangular vibration element and the second rectangular through-hole completely surrounds a second short side of the rectangular vibration element;
   a first partition wall at the first short side and a second partition wall at the second short side, both the first partition wall and the second partition wall being configured to prevent the vibration of the rectangular vibration element from being transmitted to the circuit board; and
   a cover connecting the first partition wall and the second partition wall, the cover disposed parallel and adjacent to the rectangular vibration element,
   wherein the first partition wall is disposed adjacent a first side of the first rectangular through-hole opposite a second side adjacent to the first short side and the second partition wall is disposed adjacent a first side of the second rectangular through-hole opposite a second side adjacent to the second short side, and
   wherein the first partition wall and the second partition wall protrude from the one surface.

2. The circuit board assembly of claim 1,
   wherein when the circuit board is viewed in the direction perpendicular to the one surface, the first rectangular through-hole and the second rectangular through-hole are arranged on both short sides of the rectangular vibration element in a direction in which the rectangular vibration element vibrates in parallel to the one surface.

3. The circuit board assembly of claim 2, further comprising a heat sink disposed in close contact with the second surface on an opposite side from the one surface and presses the second surface.

4. The circuit board assembly of claim 1, wherein the cover is adapted to press the vibration element toward the circuit board.

5. The circuit board assembly of claim 1, wherein the first partition wall and the second partition wall are provided in close contact with a side surface of the vibration element.

6. The circuit board assembly of claim 1, wherein the cover is configured such that the first partition wall and the second partition wall are formed integrally with the cover.

7. The circuit board assembly of claim 6, wherein the vibration element comprises a first vibration element and a second vibration element spaced apart from the first vibration element, and
   wherein when a main vibration direction is a direction of a vibration having a greatest amplitude or frequency among vibrations of the vibration element, the first vibration element and the second vibration element are arranged such that the main vibration direction of the first vibration element intersects with the main vibration direction of the second vibration element.

8. The circuit board assembly of claim 7, wherein the first vibration element and the second vibration element are arranged such that the main vibration direction of the first vibration element is perpendicular to the main vibration direction of the second vibration element.

9. The circuit board assembly of claim 1,
   wherein when the circuit board is viewed in a direction perpendicular to the one surface, the first partition wall and the second partition wall are arranged on both sides of the vibration element in a direction in which the vibration element vibrates in parallel to the one surface.

10. The circuit board assembly of claim 1, further comprising a heat sink disposed in close contact with the second surface and presses the second surface.

11. The circuit board assembly of claim 10, further comprising a tape which connects the heat sink to the circuit board and is made of a material comprising a heat conductive material.

12. The circuit board assembly of claim 10, wherein the heat sink presses an entire region of the second surface of the circuit board.

13. The circuit board assembly of claim 1, wherein the vibration element comprises a first vibration element and a second vibration element spaced apart from the first vibration element, and
   wherein when a main vibration direction is a direction of a vibration having the greatest amplitude or frequency among vibrations of the vibration element, the first vibration element and the second vibration element are arranged such that the main vibration direction of the first vibration element intersects with the main vibration direction of the second vibration element.

* * * * *